(12) United States Patent
Chapet et al.

(10) Patent No.: US 6,264,109 B1
(45) Date of Patent: Jul. 24, 2001

(54) TOKEN WITH ELECTRONIC CHIP (75) Inventors: Pierre Chapet, Gigny Beaune; Christophe Gassies, Echevronne; Dominique Boiron, Beaune; Gérard Charlier, Paris, all of (FR)

(73) Assignee: Etablissements Bourgogne et Grasset, Savigny-les-Beaune (FR)

( * ) Notice: Subject to any disclaimer, the term of this patent is extended or adjusted under 35 U.S.C. 154(b) by 0 days.

(21) Appl. No.: 09/171,917

(22) PCT Filed: Mar. 9, 1998

(86) PCT No.: PCT/FR98/00462

§ 371 Date: Oct. 29, 1998

§ 102(e) Date: Oct. 29, 1998

(87) PCT Pub. No.: WO98/39989

PCT Pub. Date: Sep. 17, 1998

(30) Foreign Application Priority Data

Mar. 10, 1997 (FR) .................................................. 97 02784
Mar. 10, 1997 (FR) .................................................. 97 02783

(51) Int. Cl.⁷ .............................. G06K 19/06; G09F 3/02
(52) U.S. Cl. .......................... 235/492; 235/487; 40/27.5; 463/25; 463/39
(58) Field of Search ................................. 235/492, 487; 40/27.5; 463/25, 29, 39

(56) References Cited

U.S. PATENT DOCUMENTS

| | | | |
|---|---|---|---|
| 3,983,646 | * 10/1976 | Howard | 40/27.5 |
| 4,827,640 | 5/1989 | Jones | 40/27.5 |
| 5,166,502 | * 11/1992 | Rendleman et al. | 235/492 |
| 5,216,234 | * 6/1993 | Bell | 235/494 |
| 5,361,885 | * 11/1994 | Modler | 194/214 |
| 5,399,847 | 3/1995 | Droz | 235/488 |
| 5,406,264 | * 4/1995 | Plonsky et al. | 235/493 |
| 5,676,376 | * 10/1997 | Valley | 273/288 |
| 5,690,773 | 11/1997 | Fidalgo et al. | 156/267 |
| 5,735,742 | * 4/1998 | French | 463/25 |
| 5,895,321 | * 4/1999 | Gassies et al. | 463/29 |
| 5,988,510 | * 11/1999 | Tuttle et al. | 235/492 |
| 6,021,949 | * 2/2000 | Boiron | 235/492 |

FOREIGN PATENT DOCUMENTS

| | | |
|---|---|---|
| 19504194 | 4/1996 | (DE) . |
| 19710656 | 9/1998 | (DE) . |
| 0412545 | 2/1991 | (EP) . |
| 0436497 | 7/1991 | (EP) . |
| 587011 | 3/1994 | (EP) . |
| 0646893 | 4/1995 | (EP) . |
| 0669597 | 8/1995 | (EP) . |
| 0694872 | 1/1996 | (EP) . |
| 2727542 | 5/1996 | (FR) . |
| 2739587 | 4/1997 | (FR) . |

OTHER PUBLICATIONS

English Language abstract of DE 197 10 656.
English Language abstract of EP 587011.

* cited by examiner

Primary Examiner—Karl D. Frech
Assistant Examiner—Jamara A. Franklin
(74) Attorney, Agent, or Firm—Greenblum & Bernstein, P.L.C.

(57) ABSTRACT

Token including a plastic cover having an external surface and a base engaging surface. A plastic base has an external surface and a cover engaging surface, the base being attached to the cover. An axial spacing projection maintains a space between the base and the cover, the axial spacing projection being disposed on the cover engaging surface of the base and including a first height. The axial spacing projection further includes one of a continuous ring and a discontinuous ring. A closure ring disposed on the base engaging surface of the cover comprises one of a continuous ring and a discontinuous ring. A peripheral annular region includes a space having a second height and is disposed adjacent an edge of the token, the peripheral annular region being defined by the axial spacing projection. The first height is approximately equal to the second height. An electronic device includes an electronic circuit which includes one of a memory containing identification, a coding information, and a transmitter-receiver having a peripheral antenna. An internal central region includes a receptacle for receiving the electronic device, the internal central region being defined by the axial spacing projection. A plastic jointing material is disposed in the peripheral annular region, wherein the plastic jointing secures the base to the cover. The closure ring includes an engaging diameter which is smaller than a diameter of the axial spacing projection such that the closure ring and the axial spacing projection engage and axially overlap one another when the cover is fixed to the base.

78 Claims, 4 Drawing Sheets

TOKEN WITH ELECTRONIC CHIP

BACKGROUND OF THE INVENTION

1. Field of the Invention

The present invention relates to tokens in the general form of a disk, or to similar devices of flat shape, incorporating an electronic chip. The applications of the invention include, inter alia, the "contact-free" identification of individuals and of objects, also called electronic labeling, and the authentication and identification of gambling chips, also called casino chips. The term "gambling chip" should be understood to mean any token which can be used in gambling halls and which may or may not have a predetermined nominal value.

2. Description of Background and Relevant Information

Patent Application EP-A-0,694,872 in the name of the Applicant describes an electronic chip incorporated into the body of a token made of a rigid and strong plastic, which thus forms a protective shell for the electronic chip. The electronic chip includes an electronic circuit having a memory containing identification and/or coding information relating to the person or to the object associated with the token (electronic label) or to the token itself (gambling chip or payment token), the electronic circuit generally being associated with a transmitter-receiver having a peripheral antenna suitable for being powered by inductive coupling.

SUMMARY OF THE INVENTION

An object of the invention is to provide a token having a relatively simple, compact and robust structure whose manufacture is facilitated in order to allow, as required, a certain amount of manufacturing automation.

To this end, the invention provides a token in the general form of a disk, or similar device of flat shape, comprising two half-disks fastened to each other, the two half-disks, made of plastic, being spaced apart by utilizing an axial spacing projection provided on the internal face of one of the half-disks or base half-disk so as to define, between the two half-disks, a peripheral annular region emerging at the edge of the token, and a plastic jointing material deposited by injection into the peripheral annular region, the axial spacing projection, of height approximately equal to that of the peripheral annular region, having the shape of a continuous or discontinuous ring defining an internal central region in the token for serving as a receptacle for an insert in the form of an electronic device comprising an electronic circuit incorporating a memory containing identification or coding information and a transmitter-receiver having a peripheral antenna, characterized in that the other half-disk or cover half-disk includes a continuous or discontinuous closure ring which bears on the receptacle ring with an axial overlap.

The structure of the token according to the invention, having asymmetric half-disks, allows there to be a large number of bearing points or points of contact between the two half-disks, these points being circularly distributed and with an axial overlap of the two rings. This results in a compact and robust token in which the electronic insert is well protected without imposing a diameter and/or thickness penalty on the token. This token structure allows easy axial centering of the two half-disks and, consequently, facilitated interlocking of the two half-disks, one with respect to the other, on, around or inside the receptacle ring.

According to a first embodiment of the token according to the invention, the receptacle ring includes a plane circular region surmounted by a band of protuberances in external position, these protuberances being distributed in a circular fashion and intended to hold the insert in place and to house the closure ring.

According to a first variant, the token includes an insert which with its antenna has the general shape of a thin tablet or wafer, the closure ring having an external side wall which comes into lateral contact with the protuberances of the receptacle ring, the wafer, after it has been mounted in the token, being held axially between the closure ring and the plane circular region of the receptacle ring. Advantageously, the wafer has a polygonal, preferably square or rectangular, shape and the band of protuberances of the receptacle ring has cuts in order to allow the tops of the wafer to project into the peripheral annular region of the token.

According to another variant, at least one of the two rings of the half-disks of the token has through-slots or through-channels for making the peripheral annular region communicate with the internal central region and for making it easier for the latter to be filled with injected material when injecting the jointing material.

According to another variant, the internal profile of the band of protuberances and the external profile of the closure ring have complementary polygonal, preferably square or rectangular, shapes.

According to yet another variant, the external profile of the closure ring is circular and the tops of the protuberances of the receptacle ring project into a shallow annular groove made in the cover half-disk.

This first embodiment is well suited to the manufacture of small tokens (for example, electronic labels). In addition, the token has a very compact and very robust structure.

According to a second embodiment of the invention, the receptacle ring includes a circular plane bearing region axially recessed by a circular annular groove intended to house a circular closure ring having a profile that is complementary to the groove. Advantageously, the groove, having a profile with a flat bottom and with flared edges, has a depth approximately equal to the height of the receptacle ring.

According to a third embodiment of the invention, the receptacle ring has a conical external profile that is complementary to the conical internal profile of the closure ring, the two rings also having approximately equal heights in order to ensure an axial overlap, between the two rings, at least equal to the height of the peripheral annular region.

According to a variant of these second and third embodiments of the invention, the internal face of the receptacle half-disk has, at the center of the internal central region, a C-shaped boss intended to house the electronic circuit and having a plane bearing region recessed by a C-shaped groove and [sic] intended to house a corresponding C-shaped protuberance made on the internal face of the cover half-disk. Advantageously, two half-disks are adhesively bonded in the C-shaped groove and on the corresponding protuberance with a cyanoacrylate or similar adhesive and the insert with an electronic circuit is held in position in the internal central region by an epoxy or similar adhesive.

These second and third embodiments are well suited to fitting tokens with an electronic insert which is unprotected or partially protected. In practice, it is possible to use and automatically deposit the two adhesives of different types without mixing them—the epoxy adhesive in the internal central region and the cyanoacrylate adhesive in the C-shaped groove.

The invention also relates to a token in the general form of a disk, or to a similar device of flat shape, comprising two half-disks fastened to each other, the two half-disks, made of plastic, being spaced apart by utilizing at least one axial spacing projection provided on at least one of the internal faces of the half-disks so as to define, between the latter, a peripheral annular region emerging at the edge of the token, and an internal central region housing an insert with an electronic circuit having a memory and a transmitter-receiver with a peripheral antenna, and a plastic jointing material deposited by injection into the peripheral annular region, characterized in that the two half-disks are injection-molded attached to each other around the periphery by a hinge, the hinge optionally being removed after the jointing material has been injected.

Although optional, the presence of the hinge between the half-disks is useful from several points of view. It allows the two half-disks to be obtained in a single injection-molding operation; it achieves angular indexation of the two half-disks; it makes it easier to automate the closure of the half-disks over the insert; finally, in the case of tokens of small diameter (for example of about 20 mm), it makes the token easier to mount.

The invention also relates to a process for manufacturing a token, according to the various structures mentioned above, which includes the following operations:
  injection molding of the two half-disks, these being separate or attached by a hinge;
  fitting of the insert having an electronic circuit, optionally with adhesive bonding, and fitting of the two half-disks;
  closure of the half-disks;
  injection of the jointing material;
  optional removal of the hinge by machining the periphery of the token.

Further objects, features and advantages of the present invention will appear upon reading the description which follows of various embodiments of the invention, these being given by way of nonlimiting examples and with reference to the appended drawings.

DETAILED DESCRIPTION OF THE INVENTION

Figure 1:
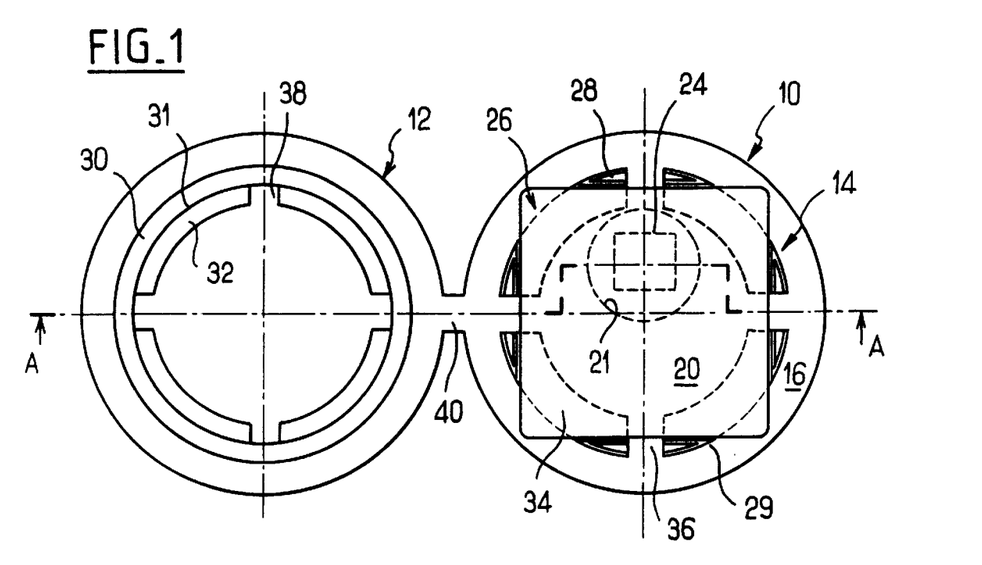
FIG. 1 shows a front view (internal face side) of the two half-disks with hinge of a token according to a first embodiment of the present invention.
Figure 2:
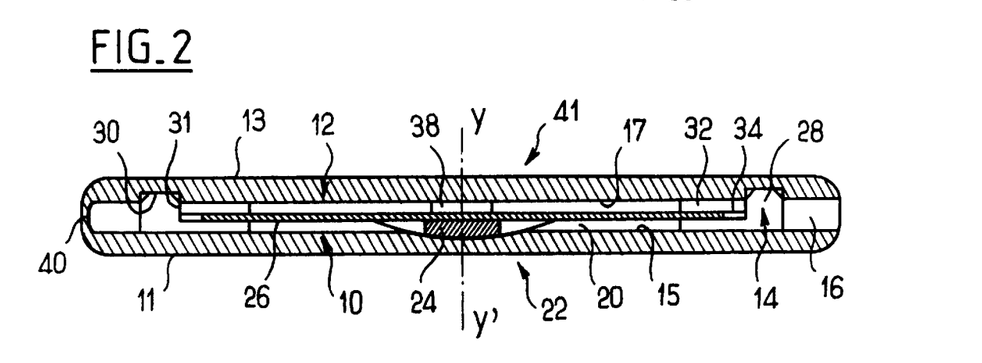
FIG. 2 shows an enlarged diametral sectional view on the line AA of the two half-disks shown in FIG. 1, these being preassembled before injection of the jointing material.
Figure 3:
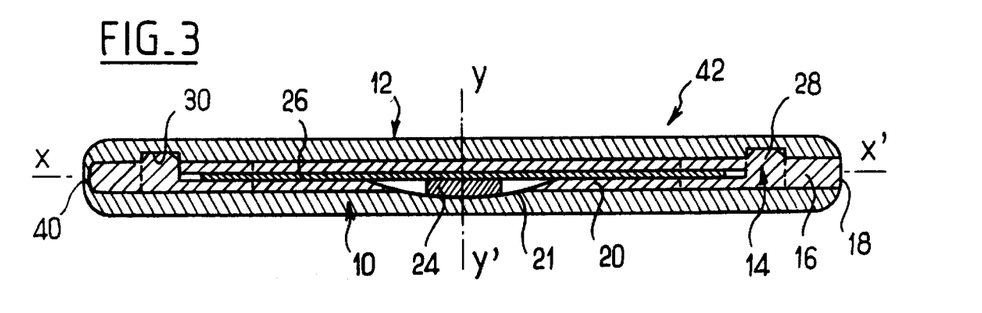
FIG. 3 shows an enlarged diametral sectional view on the line AA of the finished token incorporating the half-disks shown in FIGS. 1 and 2.

FIGS. 1 to 3 relate to a first embodiment of a token according to the invention and more particularly to a token 42 of relatively small size, approximately 20 mm in diameter and 2 mm in thickness, intended to be used as an electronic label.

The token 42 comprises two half-disks 10 and 12 of axis YY' joined together by a plastic jointing material 18 injected into the edge of the token in a peripheral annular region 16 located between the two half-disks 10 and 12. In the embodiment described here by way of nonlimiting example, the peripheral annular region is substantially in the form of a groove. For reasons of satisfying the tolerances on the token (especially tolerances relating to the planarity of the faces of the final token, on account of the risk of deformation of the external faces 11 and 13 of the half-disks 10 and 12 during injection of the jointing material 18), the two half-disks 10 and 12, which have the same thickness, lie symmetrically about the plane of symmetry XX' of the token 42 parallel to the external faces 11 and 13 and are spaced apart by way of an axial spacing projection (along the axis YY' perpendicular to the token 42), this projection utilizing, in the present case, of a discontinuous circular ring 14 provided on the internal face 15 of the half-disk 10, also called the base half-disk.

As illustrated in FIG. 1 (the half-disk on the right), the ring 14 (hereafter called the receptacle ring) is coaxial with the half-disk 10 and separates the peripheral annular region 16 from an internal central region 20 designed in particular to house an insert 22 having an electronic memory circuit 24 and of a transmitter-receiver whose peripheral antenna is incorporated into or fixed to a thin support wafer 26 of synthetic resin, for example one based on a filled epoxy resin. Without departing from the scope of the invention, the thin wafer 26 is in the form of a rigid plastic film serving as a support for the electronic circuit and for the peripheral antenna. The ring 14, which acts as the receptacle for the insert 22, includes a plane circular region 34 surmounted by a band of protuberances 28 in external position, these protuberances being distributed in a circular fashion. When the insert 22 is in place in the receptacle ring 14, the wafer 26, of polyhedral general shape, for example of square shape, rests on the plane circular region 34 and is flanked and held in place angularly by the protuberances 28. As shown in FIG. 1, the tops of the square wafer 26 project through widened cuts 29 made in the band of protuberances and extend into the annular region 16, thereby making it possible to reduce the diameter of the token and to make the arrangement of the token very compact and very robust after the jointing material has been injected. Likewise, in order to reduce the thickness of the token, a small recess 21, in the form of a spherical cap, is made in the internal central region 20 in the internal face 15 of the half-disk 10 in order to house the electronic memory circuit 24.

In general, the electronic memory device 24 comprises an electronic circuit incorporating a PROM memory containing information relating to the token and/or the person or the object associated with the token, for example a 64-bit alphanumeric or numerical fixed identification code (having one or more fields such as: the serial number, the identification of a product, of a batch or of a place, a numerical value associated with the token, etc.), and a transmitter-receiver having a peripheral antenna designed to be supplied by inductive coupling. In practice, the transmitter-receiver is able to exchange, without any contact, by modulated waves, data with a read station placed some distance away (by way of nonlimiting example, between 15 cm and 2 m), the working frequency lying between 10 kHz and 20 MHz. The electronic memory device makes it possible, for example, to combat theft and/or to facilitate the management and inventory of a batch of objects in a defined space (storage areas, warehouses, shops). Of course, without departing from the scope of the invention, the electronic memory device 24, of the nonreprogrammable (read-only) type, may be replaced by a reprogrammable device having a changing code with the possibility of reading from and writing to the memory.

The half-disk 12 or cover half-disk, which is linked to the base half-disk 10 by a hinge 40, has, on its internal face 17, an annular groove 30 (in this case a continuous groove) intended to serve as a housing for the protuberances 28, the tops of these protuberances being slightly beveled (see FIGS. 2 and 3), and a closure ring 32 (in this case a discontinuous closure ring) whose external side wall 31, after the two half-disks 10 and 12 have been "closed" or folded down, one onto the other, comes into bearing contact with the lateral internal edges of the protuberances 28 (see FIG. 2 depicting the preassembled token 41 before injection of the jointing material 18), the wafer 26 then being held axially between the closure ring 32 and the plane circular region 34 of the receptacle ring 14 of the base half-disk 10. Finally, in order to allow the injected jointing material 18 to penetrate into the internal central region 20 and almost completely encapsulate the insert 22, the two rings 14 and 32 have through-slots 36 and 38 for making the peripheral annular region 16 communicate with the internal central region 20.

Of course, without departing from the scope of the invention, the token 42 may be obtained, as a variant, without a hinge from separate half-disks injection-molded independently.

The token 42 (with or without a hinge) is manufactured by carrying out the following operations:
  injection molding of the two half-disks 10, 12, these being separate or attached by a hinge 40,
  fitting of the insert 22 having an electronic circuit, optionally with adhesive bonding, and fitting of the two half-disks 10, 12,
  closure of the half-disks 10,12,
  injection of the jointing material 18,
  optional removal of the hinge 40 by machining the periphery of the token.

It should be noted that the relatively simple and robust structure of the token 42 according to the invention, utilizing of the two half-disks 10 and 12 and the jointing 18, forms a rigid and sealed protective shell for the electronic identification device 24, 26. Moreover, the axial overlap between the protuberances 28 of the receptacle ring 14 and the closure ring 32 allows the thickness of the token to be reduced, while at the same time increasing the rigidity of the assembly. Finally, the axial centering of the half-disks 10 and 12 (provided by the protuberances 28, the groove 30 and the shoulder 31 of the ring 32) combined with the thin hinge 40 facilites interlocking of the two half-disks and consequently automation of this operation in the manufacture of the token 42.

Preferably, the two half-disks 10 and 12 attached by their hinge 40 are obtained in a single molding operation by injecting a rigid plastic. The plastics used for the half-disks and the jointing material are generally chosen from all the groups of thermoplastics (by way of nonlimiting example, polyolefins, polyamides, saturated polyesters, polycarbonates, polyoxymethylenes, polyphenylene sulfides, groups of styrene, vinyl, acrylic or fluorinated polymers, etc.), depending on the intended applications of the tokens and on the technical specifications which result therefrom, for example the manufacturing cost of the token (material/processing), the electronic compatibility, the impact strength and heat resistance, the resistance to chemical attack, the biocompatibility, the esthetic appearance and marking of the token, etc. If required, the base polymers are filled, for example in order to increase the weight and/or the rigidity of the token, or for coloring it.

In the present case, given by way of nonlimiting example, the same base polymer, in this case polypropylene, is used for the half-disks 10 and 12 and for the jointing 18, polypropylene being adopted especially for its low cost and for ensuring that there is good bonding and cohesion between the jointing and the half-disks during the final injection (by a partial melting/welding effect). In order to ensure that the half-disks 10 and 12 have a high rigidity, the material used for the half-disks 10 and 12 is a polypropylene filled with approximately 30% by weight of short glass fibers, preferably fibers of the order of 100 $\mu$m in length for a diameter of 10 $\mu$m. It is also advantageous to use, as base polymers, nylon-6 (PA6) and polyphenylene sulfide (PPS), the glass-fiber filling for the half-disks generally being between 20% and 50% by weight.

In the case of gambling or casino chips, for example for a token of the type of those illustrated in FIGS. 4, 5, 6, 11 and 12 and described below, the esthetic appearance and ease of coloration of the token, the impact strength, the resistance to chemical attack (washing with detergents), and the surface hardness are important. The plastics used for gambling chips (the half-disks on the one hand and the jointing on the other hand) may be chosen from the following: polymethyl methacrylate (PMMA), acrylonitrile-butadiene-styrene (ABS), polyacetal and acetal copolymers (POM), polyamides and their copolymers, polyphenylene sulfides (PPS), polyalkylene terephthalates, especially polybutylene terephthalate (PBT), thermoplastic polyurethanes (PUR), vinyl polymers, especially polyvinyl chloride (PVC), polyolefins, especially polyethylenes (PE) and polypropylenes, or from pairs of polymers capable of welding to each other well, preferably ABS/PMMA, ABS/PBT, nylon-6/thermoplastic polyurethane, nylon-6,6/thermoplastic polyurethane, polycarbonate/PBT. Of course, the compositions may vary, especially by fillers incorporated into the materials used for the half-disks and for the jointing: for example, weighting fillers (baryta, metal powders, zinc oxide, etc.) and pigmenting fillers (zinc oxide, etc.) for marking the edge and/or coloring the background of the external faces of the token (especially the external faces of the half-disks) which are intended to receive decorative patterns by sublimation or by pad printing, the half-disks and the jointing generally being made of different colored plastics.

FIGS. 7 to 10 relate to a token 42' intended to be used as an electronic label and representing a variant of the token 42 described with reference to FIGS. 1 to 3. The tokens 42 and 42', whose dimensions and general structures are similar, have a great number of technical characteristics which are identical or similar, which will not be described again in detail below and which bear the same numerical references but with the "'" added.

The token 42' comprises two half-disks 10' and 12', of axis YY', joined together by a plastic jointing material 18' injected into the edge of the token in a peripheral angular region 16' lying between the two half-disks 10' and 12'. The two half-disks 10' and 12', which have the same thickness, lie symmetrically about the plane of symmetry XX' of the token 42' and are spaced apart by utilizing of an axial spacing projection (along the axis YY' perpendicular to the token 42') having a discontinuous circular ring 14' provided on the internal face of the half-disk 10' (the base half-disk).

Figure 7:
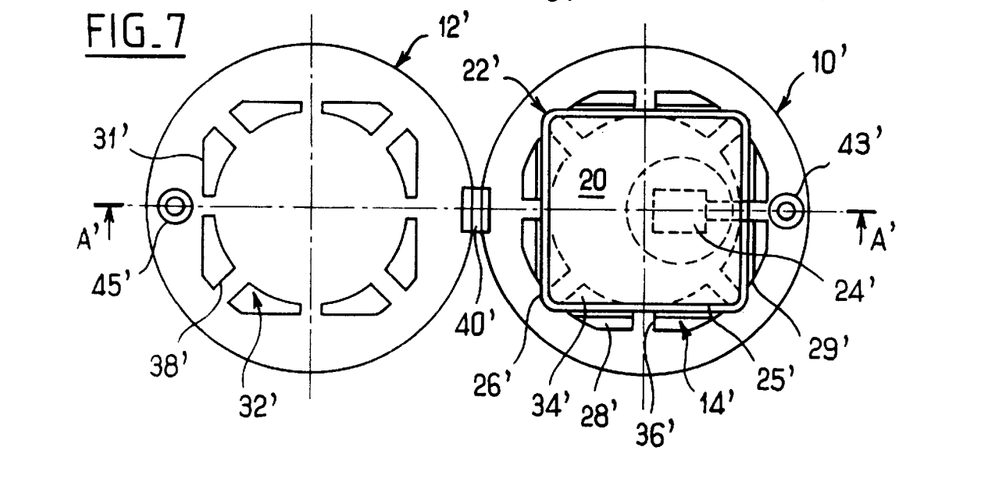
FIGS. 7 and 8 show, respectively, a front view (internal face side) and a bottom view of the two half-disks with hinge of a token according to a variant of the token shown in FIGS. 1 to 3 illustrating the first embodiment of the present invention.
Figure 8:
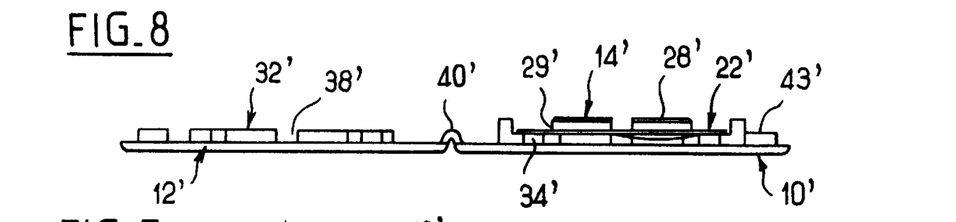

As illustrated in FIG. 1 (the half-disk on the right), the ring 14' (the receptacle ring) is coaxial with the half-disk 10' and separates the peripheral annular region 16' of an internal central region 20' which houses an insert 22' utilizing an electronic memory circuit 24' (identical or similar to the circuit 24 described above) and of a transmitter-receiver whose peripheral antenna 25' is fixed, like the circuit 24', to a thin plastic support wafer 26' (for example a rigid plastic film). The ring 14', which acts as the receptacle for the insert 22', includes a discontinuous plane circular region 34' surmounted by a band of protuberances 28' in external position, these protuberances being distributed in a circular fashion. When the insert 22' is in place in the receptacle ring 14', the square-shaped wafer 26' rests on the plane circular region 34' and is flanked and angularly held in place by the protuberances 28'. As shown in FIG. 7, the tops of the square wafer 26' project through widened cuts 29' made in the band of protuberances 28' and extend into the annular region 16'; this makes it possible to reduce the diameter of the token and to make the arrangement of the token 42' very compact and very robust after the jointing material 18' has been injected.

Figure 9:
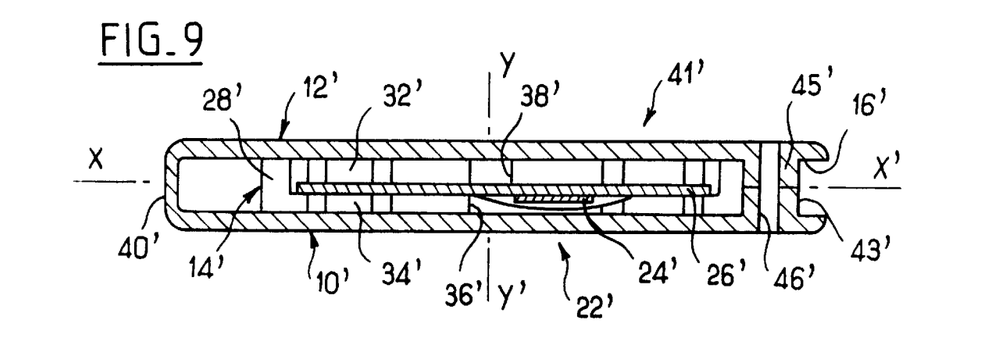
FIG. 9 shows an enlarged diametral sectional view on the line A'A' of the two half-disks shown in FIGS. 7 and 8, these being preassembled before injection of the jointing material.
Figure 10:
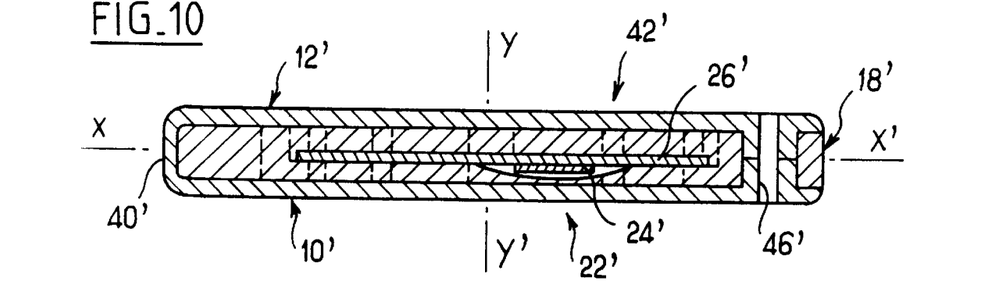
FIG. 10 shows an enlarged diametral sectional view on the line A'A' of the finished token incorporating the half-disks shown in FIGS. 7, 8 and 9.

The cover half-disk 12', which is linked to the base half-disk 10' by a hinge 40', has, on its internal face, a discontinuous closure ring 32', whose external side wall 31', in this case with a square external profile, after the two half-disks 10' and 12' have been "closed" or folded down, one onto the other, comes into contact along the lateral internal edges of the protuberances 28' arranged with a complementary square internal profile (see FIG. 9 showing the preassembled token 41' before injection of the jointing material 18'), the wafer 26' (also square, of size slightly less than that of the internal profile of the ring 14') then being held axially between the closure ring 32' and the discontinuous plane circular region 34' of the receptacle ring 14' of the base half-disk 10'. Finally, in order to allow the injected jointing material 18' to penetrate into the internal central region 20' and almost completely encapsulate the insert 22', the two rings 14' and 32' have through-slots 36' and 38' for making the peripheral annular region 16' communicate with the internal central region 20'. In order to make it easier to fasten the electronic label including the token 42', the latter includes, in the annular region 16', as illustrated in FIGS. 7 to 10, a passage 46' parallel to the axis YY' obtained by two identical cylindrical small conduits 43' and 45' side by side and made as one piece with their respective half-disks.

The half-disks 10' and 12' of the token 42', attached by their hinge 40' (of the humped type illustrated in FIG. 8) are obtained by injection molding a rigid plastic. Of course, the materials and/or material compositions and/or fillers used for the tokens 42 described above are applicable to the tokens 42'. The same applies to the operating method of manufacturing the tokens 42 and 42' (with or without a hinge).

Figure 4:
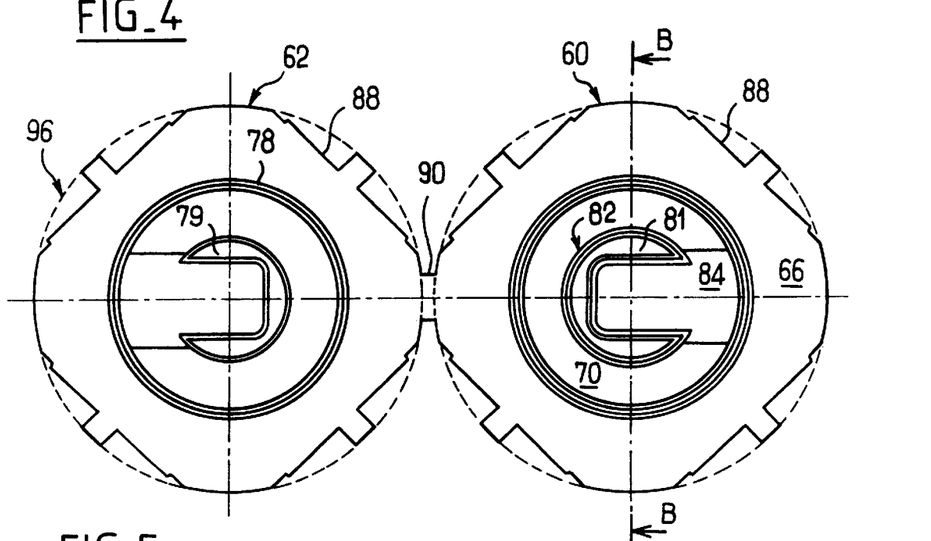
FIG. 4 shows a front view (internal face side) of the two half-disks with hinge of a token according to another embodiment of the present invention.
Figure 5:
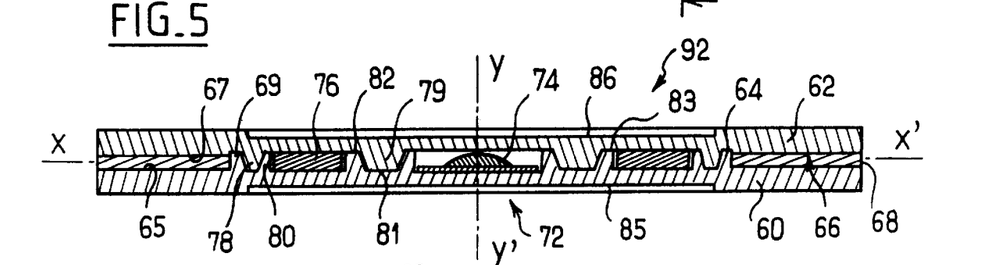
FIG. 5 shows an enlarged diametral sectional view on the line BB of the token incorporating the half-disks shown in FIG. 4 after injection of the jointing material.
Figure 6:
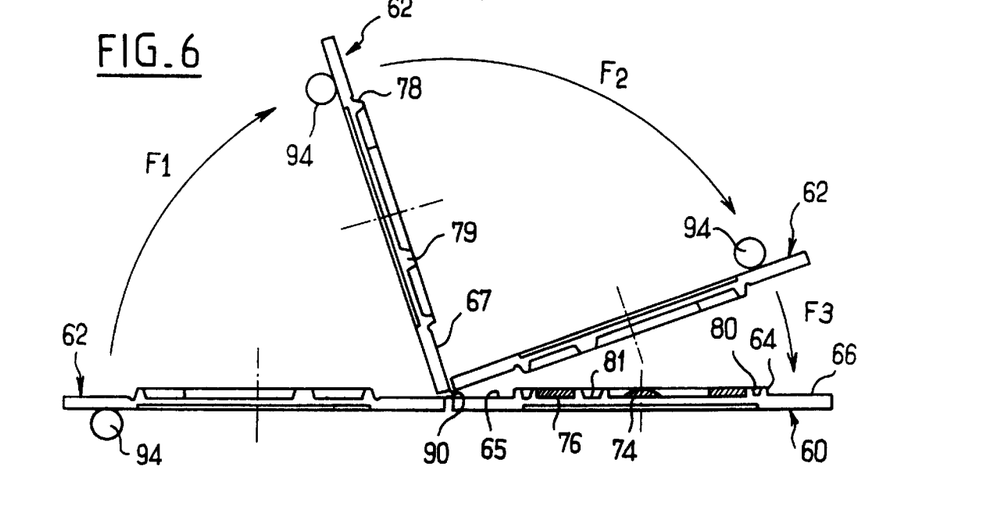
FIG. 6 shows a diagrammatic view of the half-disks shown in FIGS. 4 and 5 (the half-disks being depicted in diametral section) illustrating the automation of the closure of the cover half-disk (depicted in 3 positions) onto the base half-disk.

FIGS. 4 to 6 relate to another embodiment of the token according to the invention, more particularly to a smaller token 92, approximately 40 mm in diameter and 4 mm in thickness, intended to be used as a casino chip. This casino chip 92 has some of the similarities between the tokens 42 and 42' (for example in terms of the electronic memory device), and these will consequently not be repeated in detail below.

The casino chip 92 comprises two half-disks 60 and 62, of axis YY', joined together by a plastic jointing material 68 injected into the edge of the chip in a peripheral annular region 66 located between the two half-disks 60 and 62. In the embodiment described here by way of nonlimiting example, the two half-disks 60 and 62, which have the same thickness, lie symmetrically about the plane of symmetry XX' of the casino chip 92 parallel to the external faces of the two half-disks and spaced apart by way of an axial spacing projection (along the axis YY' perpendicular to the casino chip 92) having in the present case a circular ring 64 (receptacle ring) provided on the internal face 65 of the half-disk 60, also called the base half-disk. The ring 64 has a plane bearing region 69 recessed by an annular groove 80 and intended to house a corresponding closure ring 78 made on the internal face 67 of the cover half-disk 62. Moreover, without departing from the scope of the invention, the spacing ring 64 of the base half-disk 60 may be circular, continuous or discontinuous, coaxial with the half-disk, but also polyhedral, preferably in the form of a regular polyhedron, square, hexagon, etc.

As illustrated in FIG. 4 (the half-disk to the right), the ring 64 (which in this case is continuous) is coaxial with the half-disk 62 and separates the peripheral annular region 66 from an internal central region 70. The internal face 65 of the half-disk 60 has, at the center of the internal region 70, a C-shaped boss 82 designed in particular to house the electronic memory circuit 74 of the insert 72 and the transmitter-receiver, the peripheral antenna 76 of which is placed around the boss 82 (see FIG. 5). The boss 82 has a plane bearing region 83 recessed by a C-shaped groove 81 and intended to house a corresponding C-shaped protuberance 79 made on the internal face 67 of the cover half-disk 62. In general, the grooves 80 and 81 and the corresponding protuberances 78 and 79 have complementary profiles, the grooves 80 and 81 having a profile with a flat bottom and with flared edges in order to facilitate interlocking of the half-disks 60 and 62, the grooves 80 and 82 also having a depth substantially equal to the height of the receptacle ring 64, thus ensuring an axial overlap between the two rings. Moreover in order for the interlocked half-disks 60 and 62 to be held in place during manipulations and injection of the jointing material 68, the half-disks 60 and 62 are adhesively bonded in the C-shaped groove 81 of the protuberance 79 using a cyanoacrylate adhesive or the like. Likewise, the electronic circuit 74 and the peripheral antenna 76 are immobilized and protected by depositing an epoxy adhesive or the like in the region 70, a slight recess 84 intended to direct the epoxy adhesive around the circuit 74 being visible in FIG. 4 (the internal central region 70 being isolated from the groove 81 in order to prevent the adhesives from mixing).

In general, the two half-disks 60, 62 have continuous faces, the plane external faces being smooth or granite-like, or being substantially plane but with a central shallow recess 85, 86 for accommodating a decorative label or a pad-printed or sublimed decoration.

Moreover, the external faces of the half-disks of the tokens according to the invention may be marked, during injection of the jointing material, by filling with the colored material for the jointing, by suitable cut-outs in the half-disks (of different color from that of the jointing material) and made through the peripheral annular wall of the half-disks, the cut-outs representing various figurative patterns or the inscription of the name of the casino and/or of the value of the casino chip.

For example, the casino chip 92 shown in FIGS. 4 and 5 comprises two half-disks 60 and 62 with peripheral cut-outs 88 at the circular border 96 of the chip (shown by the dotted lines) which communicate directly with the peripheral annular region 66. During injection of the jointing material 68, the free space of the cut-outs 88 is filled with the colored jointing material, the ingress of this material taking place by flow between the two half-disks 60 and 62. Preferably, the edges of the cut-outs 88 are beveled and embedded in the plastic of the jointing 68 in order to ensure that there is locking between the jointing 68 and the half-disks 60 and 62. The half-disks 60 and 62 are attached by a thin hinge 90 and obtained by a single injection-molding operation. Of course, without departing from the scope of the invention, the casino chip 92 may, as a variant, be obtained without a hinge from separate half-disks that are injection-molded independently.

The casino chip 92 (with or without a hinge) is manufactured by carrying out the following successive operations:

injection molding of the two half-disks 60 and 62, these being separate or attached by their hinge 90;

setting the half-disks 60 and 62 flat and fitting of the electronic circuit 74 and of the antenna 76;

deposition of the epoxy adhesive;

deposition of the cyanoacrylate adhesive;

closure of the half-disks 60 and 62 by moving the cover half-disk 62 about the hinge 90;

placement of the half-disks 60 and 62 in the final injection mold and holding them under pressure, and injection of the jointing material 68 from one or more orifices into the edge of the casino chip;

optionally, removal of the hinge 90 by machining the periphery of the chip followed by polishing, if necessary.

In general, gambling chips for casinos, such as the casino chips 92, once they have been completed do not have a hinge and are obtained either directly from separate half-disks or from attached half-disks with removal of the hinge.

By way of nonlimiting example, the gambling chips 92 thus obtained are in the form of a disk approximately 40 mm in diameter and between 3 and 4 mm in thickness, with a jointing thickness of between one third and one fifth of that of the gambling chip.

FIG. 6 illustrates, by way of nonlimiting example, a diagram showing the principle of the automation of the closure of the half-disks 60 and 62 by rotational movement in the direction of the arrows F1, F2 and F3 of the cover half-disk 62 about the hinge 90 by way of a roller 94 (shown in 3 successive positions from the left [flat position] to the right in FIG. 6).

Figure 11:
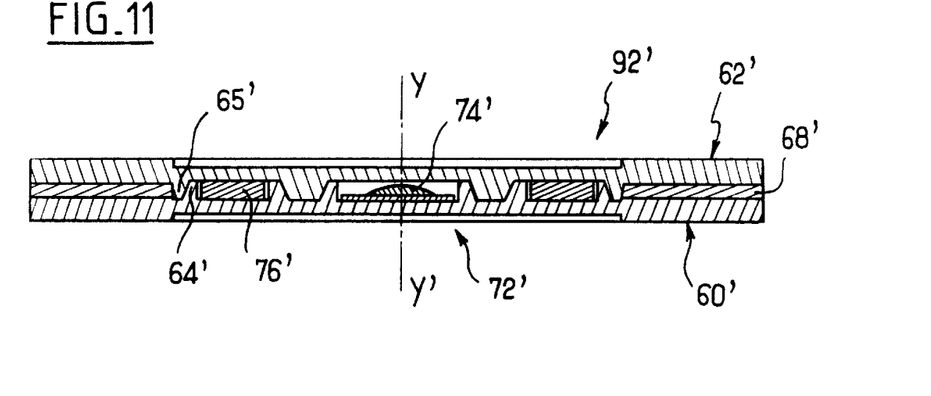
FIG. 11 shows an enlarged diametral sectional view of a first variant of the token shown in FIG. 5, depicting the half-disks after injection of the jointing material.

The gambling chip 92' illustrated in FIG. 11 represents a variant of the chip 92 described above and has a large number of technical similarities with this chip 92 (for example in terms of the insert and the associated electronic memory device 72, 74 and 76, these being renumbered as 72', 74' and 76' in FIG. 11); consequently, the technical characteristics common to the chips 92 and 92' will not be described again.

The difference between the chips 92 and 92' lies in the closure contact between the receptacle ring 64' forming part of the base disk [sic] 60' and the closure ring 65' forming part of the cover half-disk 62'. More specifically, the receptacle half-disk 60' has a conical external profile against which the conical internal profile of the closure ring 65' bears, the two rings 64', 65' also having heights approximately equal to the thickness of the jointing 68' in order to ensure that there is a good axial overlap between the two rings and that the two half-disks 60' and 62' attached by their hinge (not shown) interlock easily.

Figure 12:
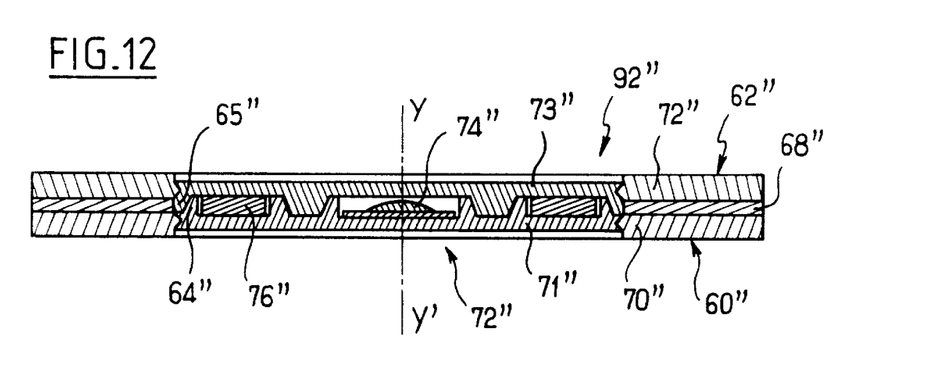
FIG. 12 shows an enlarged diametral sectional view of a second variant of the token shown in FIG. 5, depicting the half-disks after injection of the jointing material.

Of course, the two types of closures described for the gambling chips 92 and 92' having one-piece half-disks are applicable to gambling chips having composite half-disks in which each half-disk has a central part comprising the corresponding ring and made from a plastic weighted by densifying fillers (for example, metal and/or mineral fillers) and an annular part opposite the peripheral annular region receiving the jointing material. By way of nonlimiting example, FIG. 12 shows a gambling chip 92" which is technically very similar to the chip 92' (with conical intersection of the rings 64" and 65") but made from composite half-disks, the receptacle half-disk 60" having a central part 71", made of a weighted material, which carries the ring 64" with a conical external edge and is surrounded by an annular part 70" and the cover half-disk 62" having a central part 73", made of a weighted material, which carries the ring 65" with a conical internal edge and is surrounded by an annular part 72".

It should be noted that if the presence of an attaching hinge between the half-disks (for example, the hinges 40 and 90 in the case of the token 42 and the casino chip 92) is advantageous, especially for automating the manufacture of the tokens or chips, this hinge is, however, merely one option and that the invention also covers tokens or chips made from half-disks [lacuna] are obtained independently, especially from half-disks shaped as the half-disks 10, 12, 60, 62 and obtained by separate injection molding operations.

What is claimed is:

1. A token comprising:

a plastic cover having an external surface and a base engaging surface;

a plastic base having an external surface and a cover engaging surface, the base being attached to the cover;

an axial spacing projection for maintaining a space between the base and the cover, the axial spacing projection being disposed on the cover engaging surface of the base and comprising a first height, wherein the axial spacing projection further comprises one of a continuous ring and a discontinuous ring;

a closure ring disposed on the base engaging surface of the cover and comprising one of a continuous ring and a discontinuous ring;

a peripheral annular region comprising a space having a second height and disposed adjacent an edge of the token, the peripheral annular region being defined by the axial spacing projection, wherein the first height is approximately equal to the second height;

an electronic device comprising an electronic circuit which includes one of a memory containing identification, a coding information, and a transmitter-receiver having a peripheral antenna;

an internal central region comprising a receptacle for receiving the electronic device, the internal central region being defined by the axial spacing projection;

a plastic jointing material disposed in the peripheral annular region, wherein the plastic jointing secures the base to the cover, wherein the closure ring comprises an engaging diameter which is smaller than a diameter of the axial spacing projection such that the closure ring and the axial spacing projection engage and axially overlap one another when the cover is fixed to the base, and wherein the continuous ring or the discontinuous ring of the axial spacing projection comprises a plane circular region surmounted by a band of protuberances disposed in a surface of the axial spacing projection, the protuberances being utilized to retain the electronic device and being arranged in a circular arrangement.

2. The token of claim 1, wherein each of the base and cover comprise a disk shape.

3. The token of claim 1, wherein the plastic jointing material is injected into the peripheral annular region.

4. The token of claim 1, wherein the electronic device comprises an antenna and is in the form of one of wafer and a thin table.

5. The token of claim 4, wherein the closure ring comprises a side wall which laterally engages the protuberances and wherein the electronic device is axially retained between the closure ring and the place circular region.

6. The token of claim 5, wherein the electronic device comprises an antenna and is in the form of one of wafer having one of a polygonal shape, a square shape, and a rectangular shape.

7. The token of claim 6, wherein the band of protuberances comprises widened cuts which allow portions of the wafer to project into the peripheral annular region.

8. The token of claim 6, wherein a profile of the closure ring and a profile of the band of protuberances have complementary shapes.

9. The token of claim 6, wherein the cover further comprises a shallow annular groove disposed on the base engaging surface with the protuberances projecting into the annular groove.

10. The token of claim 1, wherein one of the axial spacing projection and the closure ling include openings comprising one of through-slots and through-channels which extend from the internal central region to the peripheral annular region, the openings allowing the jointing material to flow from the peripheral annular region to the internal central region.

11. The token of claim 1, wherein the base and the cover are bonded to each other via one of an adhesive, a cyanoacrylate adhesive, and an epoxy.

12. The token of claim 1, wherein the electronic device is secured to the token via one of an adhesive, a cyanoacrylate adhesive, and an epoxy.

13. The token of claim 1, wherein one of the base, the cover, and the jointing material comprise a polymer.

14. The token of claim 13, wherein the polymer comprises one of PMMA, ABS, polyamides, copolymers of polyamides, polyacetal, copolymers of polyacetal, PPS, polyalkylene terephthalates, PBT, PUR, vinyl polymer, PVC, polyolefin, PE, and polypropylene.

15. The token of claim 13, wherein the polymer comprises one of PA6, PPS, and polypropylene and wherein the material of the cover and base comprises about 30% by weight short glass fibers.

16. The token of claim 15, wherein the fibers comprise a length of about 100 $\mu$m and a diameter of about 10 $\mu$m.

17. The token of claim 1, wherein the base and the cover are simultaneously formed by injection molding.

18. The token of claim 1, wherein each of the base and the cover comprise a cylindrical small conduit disposed on a corresponding base and cover engaging surface.

19. The token of claim 1, wherein each of the base and cover is one of separately injected molded and simultaneously injection molded so as to have a connecting hinge;

wherein the electronic device is secured within the token after the base and the cover are injected molded and before the base is fixed to the cover; and wherein the base is fixed to the cover by injecting jointing material into the peripheral annular region.

20. A token comprising:

a plastic cover having an external surface and a base engaging surface;

a plastic base having an external surface and a cover engaging surface, the base being attached to the cover;

an axial spacing projection for maintaining a space between the base and the cover, the axial spacing projection being disposed on the cover engaging surface of the base and comprising a first height, wherein the axial spacing projection further comprises one of a continuous ring and a discontinuous ring;

a closure ring disposed on the base engaging surface of the cover and comprising one of a continuous ring and a discontinuous ring;

a peripheral annular region comprising a space having a second height and disposed adjacent an edge of the token, the peripheral annular region being defined by the axial spacing projection, wherein the first height is approximately equal to the second height;

an electronic device comprising an electronic circuit which includes one of a memory containing identification, a coding information, and a transmitter-receiver having a peripheral antenna;

an internal central region comprising a receptacle for receiving the electronic device, the internal central region being defined by the axial spacing projection;

a plastic jointing material disposed in the peripheral annular region, wherein the plastic jointing secures the base to the cover, wherein the closure ring comprises an engaging diameter which is smaller than a diameter of the axial spacing projection such that the closure ring and the axial spacing projection engage and axially overlap one another when the cover is fixed to the base, wherein the base and the cover are simultaneously formed by injection molding, and wherein the base and the cover are formed with a connecting hinge which is removable once the base is fixed to the cover.

21. A token comprising:

a plastic cover having an external surface and a base engaging surface;

a plastic base having an external surface and a cover engaging surface, the base being attached to the cover;

an axial spacing projection for maintaining a space between the base and the cover, the axial spacing projection being disposed on the cover engaging surface of the base and comprising a first height, wherein the axial spacing projection further comprises one of a continuous ring and a discontinuous ring;

a closure ring disposed on the base engaging surface of the cover and comprising one of a continuous ring and a discontinuous ring;

a peripheral annular region comprising a space having a second height and disposed adjacent an edge of the token, the peripheral annular region being defined by the axial spacing projection, wherein the first height is approximately equal to the second height;

an electronic device comprising an electronic circuit which includes one of a memory containing identification, a coding information, and a transmitter-receiver having a peripheral antenna;

an internal central region comprising a receptacle for receiving the electronic device, the internal central region being defined by the axial spacing projection;

a plastic jointing material disposed in the peripheral annular region, wherein the plastic jointing secures the base to the cover, wherein the closure ring comprises an engaging diameter which is smaller than a diameter of the axial spacing projection such that the closure ring and the axial spacing projection engage and axially overlap one another when the cover is fixed to the base, wherein each of the base and cover is one of separately injected molded and simultaneously injection molded so as to have a connecting hinge;

wherein the electronic device is secured within the token after the base and the cover are injected molded and before the base is fixed to the cover; and wherein the base is fixed to the cover by injecting jointing material into the peripheral annular region, and wherein each of the base and cover is simultaneously injection molded so as to have a connecting hinge and wherein the connecting hinge is removed after the base is fixed to the cover by injecting jointing material into the peripheral annular region.

22. A token comprising:

a plastic cover having an external surface and a base engaging surface;

a plastic base having an external surface and a cover engaging surface, the base being attached to the cover;

an axial spacing projection for maintaining a space between the base and the cover, the axial spacing projection being disposed on the cover engaging surface of the base and comprising a first height, wherein the axial spacing projection further comprises one of a continuous ring and a discontinuous ring;

a closure ring disposed on the base engaging surface of the cover and comprising one of a continuous ring and a discontinuous ring, the closure ring further comprising an outside diameter which is smaller than an inside diameter of the axial spacing projection;

an annular groove disposed on the cover engaging surface of the base and comprising one of a continuous ring and a discontinuous ring, the annular groove being disposed adjacent the axial spacing projection and having an outside diameter which is smaller than an inside diameter of the closure ring;

a peripheral annular region comprising a space having a second height and disposed adjacent an edge of the token, the peripheral annular region being defined by the axial spacing projection, wherein the first height is approximately equal to the second height;

an electronic device comprising an electronic circuit which includes one of a memory containing identification, a coding information, and a transmitter-receiver having a peripheral antenna;

an internal central region comprising a receptacle for receiving the electronic device, the internal central region being defined by the axial spacing projection;

a plastic jointing material disposed in the peripheral annular region, wherein the plastic jointing secures the base to the cover, wherein the closure ring engages each of the axial spacing projection and the annular groove such that the closure ring axially overlaps the axial spacing projection when the cover is fixed to the base, and wherein the internal central region defines a housing formed by a c-shaped protuberance which engages a c-shaped groove, the housing being adapted to receive the electronic device.

23. The token of claim 22, wherein the annular groove comprises a flat bottom portion and flared side portions.

24. The token of claim 23, wherein the annular groove comprises a depth which is approximately equal to each of the first height and the second height.

25. The token of claim 22, wherein the c-shaped protuberance and the c-shaped groove comprise complementary profiles having corresponding flat surfaces and corresponding flared sides.

26. The token of claim 22, wherein the base and the cover are bonded to each other via the c-shaped protuberance and the c-shaped groove.

27. The token of claim 26, wherein the base and the cover are bonded to each other via one of an adhesive, a cyanoacrylate adhesive, and an epoxy.

28. The token of claim 22, wherein the electronic device is secured to the token via one of an adhesive, a cyanoacrylate adhesive, and an epoxy.

29. The token of claim 22, wherein one of the base, the cover, and the jointing material comprise a polymer.

30. The token of claim 29, wherein the polymer comprises one of PMMA, ABS, polyamides, copolymers of polyamides, polyacetal, copolymers of polyacetal, PPS, polyalkylene terephthalates, PBT, PUR, vinyl polymer, PVC, polyolefin, PE, and polypropylene.

31. The token of claim 29, wherein the polymer comprises one of PA6, PPS, and polypropylene and wherein the material of the cover and base comprises about 30% by weight short glass fibers.

32. The token of claim 31, wherein the fibers comprise a length of about 100 $\mu$m and a diameter of about 10 $\mu$m.

33. The token of claim 22, wherein the base and the cover are simultaneously formed by injection molding.

34. The token of claim 22, wherein each of the base and cover is one of separately injected molded and simultaneously injection molded so as to have a connecting hinge;

wherein the electronic device is secured within the token after the base and the cover are injected molded and before the base is fixed to the cover; and wherein the base is fixed to the cover by injecting jointing material into the peripheral annular region.

35. A token comprising:

a plastic cover having an external surface and a base engaging surface;

a plastic base having an external surface and a cover engaging surface, the base being attached to the cover;

an axial spacing projection for maintaining a space between the base and the cover, the axial spacing projection being disposed on the cover engaging surface of the base and comprising a first height, wherein the axial spacing projection further comprises one of a continuous ring and a discontinuous ring;

a closure ring disposed on the base engaging surface of the cover and comprising one of a continuous ring and a discontinuous ring, the closure ring further comprising an outside diameter which is smaller than an inside diameter of the axial spacing projection;

an annular groove disposed on the cover engaging surface of the base and comprising one of a continuous ring and a discontinuous ring, the annular groove being disposed adjacent the axial spacing projection and having an outside diameter which is smaller than an inside diameter of the closure ring;

a peripheral annular region comprising a space having a second height and disposed adjacent an edge of the token, the peripheral annular region being defined by the axial spacing projection, wherein the first height is approximately equal to the second height;

an electronic device comprising an electronic circuit which includes one of a memory containing identification, a coding information, and a transmitter-receiver having a peripheral antenna;

an internal central region comprising a receptacle for receiving the electronic device, the internal central region being defined by the axial spacing projection;

a plastic jointing material disposed in the peripheral annular region, wherein the plastic jointing secures the base to the cover, wherein the closure ring engages each of the axial spacing projection and the annular groove such that the closure ring axially overlaps the axial spacing projection when the cover is fixed to the base, wherein the base and the cover are simultaneously formed by injection molding, and wherein the base and the cover are formed with a connecting hinge which is removable once the base is fixed to the cover.

36. A token comprising:

a plastic cover having an external surface and a base engaging surface;

a plastic base having an external surface and a cover engaging surface, the base being attached to the cover;

an axial spacing projection for maintaining a space between the base and the cover, the axial spacing projection being disposed on the cover engaging surface of the base and comprising a first height, wherein the axial spacing projection further comprises one of a continuous ring and a discontinuous ring;

a closure ring disposed on the base engaging surface of the cover and comprising one of a continuous ring and a discontinuous ring, the closure ring further comprising an outside diameter which is smaller than an inside diameter of the axial spacing projection;

an annular groove disposed on the cover engaging surface of the base and comprising one of a continuous ring and a discontinuous ring, the annular groove being disposed adjacent the axial spacing projection and having an outside diameter which is smaller than an inside diameter of the closure ring;

a peripheral annular region comprising a space having a second height and disposed adjacent an edge of the token, the peripheral annular region being defined by the axial spacing projection, wherein the first height is approximately equal to the second height;

an electronic device comprising an electronic circuit which includes one of a memory containing identification, a coding information, and a transmitter-receiver having a peripheral antenna;

an internal central region comprising a receptacle for receiving the electronic device, the internal central region being defined by the axial spacing projection;

a plastic jointing material disposed in the peripheral annular region, wherein the plastic jointing secures the base to the cover, wherein the closure ring engages each of the axial spacing projection and the annular groove such that the closure ring axially overlaps the axial spacing projection when the cover is fixed to the base, wherein each of the base and cover is one of separately injected molded and simultaneously injection molded so as to have a connecting hinge;

wherein the electronic device is secured within the token after the base and the cover are injected molded and before the base is fixed to the cover;

wherein the base is fixed to the cover by injecting jointing material into the peripheral annular region, and wherein each of the base and cover is simultaneously injection molded so as to have a connecting hinge and wherein the connecting hinge is removed after the base is fixed to the cover by injecting jointing material into the peripheral annular region.

37. A token comprising:

a plastic cover having an external surface and a base engaging surface;

a plastic base having an external surface and a cover engaging surface, the base being attached to the cover;

an outer axial spacing projection for maintaining a space between the base and the cover, the outer axial spacing projection being disposed on the cover engaging surface of the base and comprising a first height, wherein the outer axial spacing projection further comprises one of a continuous ring and a discontinuous ring;

an inner axial spacing projection for maintaining a space between the base and the cover, the inner axial spacing projection being disposed on the cover engaging surface of the base and comprising a first height, wherein the inner axial spacing projection further comprises one of a continuous ring and a discontinuous ring;

a closure ring disposed on the base engaging surface of the cover and comprising one of a continuous ring and a discontinuous ring, the closure ring further comprising an inside diameter which is larger than an outside diameter of the outer axial spacing projection;

an annular groove disposed on the cover engaging surface of the base and comprising one of a continuous ring and a discontinuous ring, the annular groove being disposed bet ween the outer axial spacing projection and the inner axial spacing projection and defining an annular space for retaining a peripheral antenna;

a peripheral annular region comprising a space having a second height and disposed adjacent an edge of the token, the peripheral annular region being defined by the closure ring, wherein the first height is approximately equal to the second height;

an electronic device comprising an electronic circuit which includes one of a memory containing identification, a coding information, and a transmitter-receiver having a peripheral antenna;

an internal central region comprising a receptacle for receiving the electronic device, the internal central region being defined by the inner axial spacing projection;

a plastic jointing material disposed in the peripheral annular region, wherein the plastic jointing secures the base to the cover, wherein the closure ring engages and overlaps the outer axial spacing projection when the cover is fixed to the base, and wherein the internal central region defines a housing formed by a c-shaped protuberance which engages a c-shaped groove, the housing being adapted to receive the electronic device.

38. The token of claim 37, wherein the electronic device is secured to the token via one of an adhesive, a cyanoacrylate adhesive, and an epoxy.

39. The token of claim 37, wherein one of the base, the cover, and the jointing material comprise a polymer.

40. The token of claim 39, wherein the polymer comprises one of PMMA, ABS, polyamides, copolymers of polyamides, polyacetal, copolymers of polyacetal, PPS, polyalkylene terephthalates, PBT, PUR, vinyl polymer, PVC, polyolefin, PE, and polypropylene.

41. The token of claim 39, wherein the polymer comprises one of PA6, PPS, and polypropylene and wherein the material of the cover and base comprises about 30% by weight short glass fibers.

42. The token of claim 41, wherein the fibers comprise a length of about 100 $\mu$m and a diameter of about 10 $\mu$m.

43. The token of claim 37, wherein the base and the cover are simultaneously formed by injection molding.

44. The token of claim 37, wherein each of the base and cover is one of separately injected molded and simultaneously injection molded so as to have a connecting hinge;

wherein the electronic device is secured within the token after the base and the cover are injected molded and before the base is fixed to the cover; and wherein the base is fixed to the cover by injecting jointing material into the peripheral annular region.

45. A token comprising:

a plastic cover having an external surface and a base engaging surface;

a plastic base having an external surface and a cover engaging surface, the base being attached to the cover;

an outer axial spacing projection for maintaining a space between the base and the cover, the outer axial spacing projection being disposed on the cover engaging surface of the base and comprising a first height, wherein the outer axial spacing projection further comprises one of a continuous ring and a discontinuous ring;

an inner axial spacing projection for maintaining a space between the base and the cover, the inner axial spacing projection being disposed on the cover engaging surface of the base and comprising a first height, wherein the inner axial spacing projection further comprises one of a continuous ring and a discontinuous ring;

a closure ring disposed on the base engaging surface of the cover and comprising one of a continuous ring and a discontinuous ring, the closure ring further comprising an inside diameter which is larger than an outside diameter of the outer axial spacing projection;

an annular groove disposed on the cover engaging surface of the base and comprising one of a continuous ring and a discontinuous ring, the annular groove being disposed between the outer axial spacing projection and the inner axial spacing projection and defining an annular space for retaining a peripheral antenna;

a peripheral annular region comprising a space having a second height and disposed adjacent an edge of the token, the peripheral annular region being defined by the closure ring, wherein the first height is approximately equal to the second height;

an electronic device comprising an electronic circuit which includes one of a memory containing identification, a coding information, and a transmitter-receiver having a peripheral antenna;

an internal central region comprising a receptacle for receiving the electronic device, the internal central region being defined by the inner axial spacing projection;

a plastic jointing material disposed in the peripheral annular region, wherein the plastic jointing secures the base to the cover, wherein the closure ring engages and overlaps the outer axial spacing projection when the cover is fixed to the base, and wherein the c-shaped protuberance and the c-shaped groove comprise complementary profiles having corresponding flat surfaces and corresponding flared sides.

46. The token of claim 45, wherein the base and the cover are bonded to each other via the c-shaped protuberance and the c-shaped groove.

47. The token of claim 46, wherein the base and the cover are bonded to each other via one of an adhesive, a cyanoacrylate adhesive, and an epoxy.

48. A token comprising:

a plastic cover having an external surface and a base engaging surface;

a plastic base having an external surface and a cover engaging surface, the base being attached to the cover;

an outer axial spacing projection for maintaining a space between the base and the cover, the outer axial spacing projection being disposed on the cover engaging surface of the base and comprising a first height, wherein the outer axial spacing projection further comprises one of a continuous ring and a discontinuous ring;

an inner axial spacing projection for maintaining a space between the base and the cover, the inner axial spacing projection being disposed on the cover engaging surface of the base and comprising a first height, wherein the inner axial spacing projection further comprises one of a continuous ring and a discontinuous ring;

a closure ring disposed on the base engaging surface of the cover and comprising one of a continuous ring and a discontinuous ring, the closure ring further comprising an inside diameter which is larger than an outside diameter of the outer axial spacing projection;

an annular groove disposed on the cover engaging surface of the base and comprising one of a continuous ring and a discontinuous ring, the annular groove being disposed between the outer axial spacing projection and the inner axial spacing projection and defining an annular space for retaining a peripheral antenna;

a peripheral annular region comprising a space having a second height and disposed adjacent an edge of the token, the peripheral annular region being defined by the closure ring, wherein the first height is approximately equal to the second height;

an electronic device comprising an electronic circuit which includes one of a memory containing identification, a coding information, and a transmitter-receiver having a peripheral antenna;

an internal central region comprising a receptacle for receiving the electronic device, the internal central region being defined by the inner axial spacing projection;

a plastic jointing material disposed in the peripheral annular region, wherein the plastic jointing secures the base to the cover, wherein the closure ring engages and overlaps the outer axial spacing projection when the cover is fixed to the base, wherein the base and the cover are simultaneously formed by injection molding, and wherein the base and the cover are formed with a connecting hinge which is removable once the base is fixed to the cover.

49. A token comprising:

a plastic cover having an external surface and a base engaging surface;

a plastic base having an external surface and a cover engaging surface, the base being attached to the cover;

an outer axial spacing projection for maintaining a space between the base and the cover, the outer axial spacing projection being disposed on the cover engaging surface of the base and comprising a first height, wherein the outer axial spacing projection further comprises one of a continuous ring and a discontinuous ring;

an inner axial spacing projection for maintaining a space between the base and the cover, the inner axial spacing projection being disposed on the cover engaging surface of the base and comprising a first height, wherein the inner axial spacing projection further comprises one of a continuous ring and a discontinuous ring;

a closure ring disposed on the base engaging surface of the cover and comprising one of a continuous ring and a discontinuous ring, the closure ring further comprising an inside diameter which is larger than an outside diameter of the outer axial spacing projection;

an annular groove disposed on the cover engaging surface of the base and comprising one of a continuous ring and a discontinuous ring, the annular groove being disposed between the outer axial spacing projection and the inner axial spacing projection and defining an annular space for retaining a peripheral antenna;

a peripheral annular region comprising a space having a second height and disposed adjacent an edge of the token, the peripheral annular region being defined by the closure ring, wherein the first height is approximately equal to the second height;

an electronic device comprising an electronic circuit which includes one of a memory containing identification, a coding information, and a transmitter-receiver having a peripheral antenna;

an internal central region comprising a receptacle for receiving the electronic device, the internal central region being defined by the inner axial spacing projection;

a plastic jointing material disposed in the peripheral annular region, wherein the plastic jointing secures the base to the cover, wherein the closure ring engages and overlaps the outer axial spacing projection when the cover is fixed to the base, wherein each of the base and cover is one of separately injection molded and simultaneously injection molded so as to have a connecting hinge;

wherein the electronic device is secured within the token after the base and the cover are injection molded and before the base is fixed to the cover;

wherein the base is fixed to the cover by injecting jointing material into the peripheral annular region, and wherein each of the base and cover is simultaneously injection molded so as to have a connecting hinge and wherein the connecting hinge is removed after the base is fixed to the cover by injecting jointing material into the peripheral annular region.

50. A token comprising:

a plastic cover having an external surface and a base engaging surface;

a plastic base having an external surface and a cover engaging surface, the base being attached to the cover;

an axial spacing projection for maintaining a space between the base and the cover, the axial spacing projection being disposed on the cover engaging surface of the base and comprising a first height, wherein the axial spacing projection further comprises one of a continuous ring and a discontinuous ring;

a closure ring disposed on the base engaging surface of the cover and comprising one of a continuous ring and a discontinuous ring;

a peripheral annular region comprising a space having a second height and disposed adjacent an edge of the token, the peripheral annular region being defined by the axial spacing projection, wherein the first height is approximately equal to the second height;

an electronic device comprising an electronic circuit which includes one of a memory containing identification, a coding information, and a transmitter-receiver having a peripheral antenna;

an internal central region comprising a receptacle for receiving the electronic device, the internal central region being defined by the axial spacing projection;

a plastic jointing material disposed in the peripheral annular region, wherein the plastic jointing secures the base to the cover, wherein the axial spacing projection comprises a plane circular region surmounted by a band of protuberances which are arranged in a circular arrangement, the plane circular region and the band of protuberances cooperating to retain the electronic device in place within the token and wherein the closure ring and the axial spacing projection engage and axially overlap one another when the cover is fixed to the base.

51. The token of claim 50, wherein each of the base and cover comprise a disk shape.

52. The token of claim 50, wherein the plastic jointing material is injected into the peripheral annular region.

53. The token of claim 50, wherein the electronic device comprises an antenna and is in the form of one of wafer and a thin table.

54. The token of claim 53, wherein the electronic device comprises an antenna and is in the form of one of wafer having one of a polygonal shape, a square shape, and a rectangular shape.

55. The token of claim 54, wherein the band of protuberances comprises widened cuts which allow portions of the wafer to project into the peripheral annular region.

56. The token of claim 54, wherein a profile of the closure ring and a profile of the band of protuberances have complementary shapes.

57. The token of claim 50, wherein one of the axial spacing projection and the closure ring include openings comprising one of through-slots and through-channels which extend from the internal central region to the peripheral annular region, the openings allowing the jointing material to flow from the peripheral annular region to the internal central region.

58. The token of claim 50, wherein the base and the cover are bonded to each other via one of an adhesive, a cyanoacrylate adhesive, and an epoxy.

59. The token of claim 50, wherein the electronic device is secured to the token via one of an adhesive, a cyanoacrylate adhesive, and an epoxy.

60. The token of claim 50, wherein one of the base, the cover, and the jointing material comprise a polymer.

61. The token of claim 60, wherein the polymer comprises one of PMMA, ABS, polyamides, copolymers of polyamides, polyacetal, copolymers of polyacetal, PPS, polyalkylene terephthalates, PBT, PUR, vinyl polymer, PVC, polyolefin, PE, and polypropylene.

62. The token of claim 60, wherein the polymer comprises one of PA6, PPS, and polypropylene and wherein the material of the cover and base comprises about 30% by weight short glass fibers.

63. The token of claim 62, wherein the fibers comprise a length of about 100 $\mu$m and a diameter of about 10 $\mu$m.

64. The token of claim 50, wherein the base and the cover are simultaneously formed by injection molding.

65. The token of claim 64, wherein the base and the cover are formed with a connecting hinge which is removable once the base is fixed to the cover.

66. The token of claim 50, wherein each of the base and the cover comprise a cylindrical small conduit disposed on a corresponding base and cover engaging surface.

67. The token of claim 50, wherein each of the base and cover is one of separately injected molded and simultaneously injection molded so as to have a connecting hinge;
   wherein the electronic device is secured within the token after the base and the cover are injected molded and before the base is fixed to the cover; and
   wherein the base is fixed to the cover by injecting jointing material into the peripheral annular region.

68. The token of claim 67, wherein each of the base and cover is simultaneously injection molded so as to have a connecting hinge and wherein the connecting hinge is removed after the base is fixed to the cover by injecting jointing material into the peripheral annular region.

69. A method of making a token comprising a plastic cover having an external surface and a base engaging surface, a plastic base having an external surface and a cover engaging surface, the base being attached to the cover, an axial spacing projection for maintaining a space between the base and the cover, the axial spacing projection being disposed on the cover engaging surface of the base and comprising a first height, wherein the axial spacing projection further comprises one of a continuous ring and a discontinuous ring, a closure ring disposed on the base engaging surface of the cover and comprising one of a continuous ring and a discontinuous ring, a peripheral annular region comprising a space having a second height and disposed adjacent an edge of the token, the peripheral annular region being defined by the axial spacing projection, wherein the first height is approximately equal to the second height, an electronic device comprising an electronic circuit which includes one of a memory containing identification, a coding information, and a transmitter-receiver having a peripheral antenna, an internal central region comprising a receptacle for receiving the electronic device, the internal central region being defined by the axial spacing projection, a plastic jointing material disposed in the peripheral annular region, wherein the plastic jointing secures the base to the cover, wherein the closure ring comprises an engaging diameter which is smaller than a diameter of the axial spacing projection such that the closure ring and the axial spacing projection engage and axially overlap one another when the cover is fixed to the base, the method comprising:
   forming the plastic cover and the plastic base by injection molding;
   locating the electronic device between the plastic cover and the plastic base;
   joining the plastic cover and the plastic base; and
   injecting the plastic jointing material between the plastic cover and the plastic base to fixedly secure the plastic cover to the plastic base,
   wherein the forming comprises injection molding the base and the cover simultaneously, and
   wherein the base and the cover are injection molded with a connecting hinge and wherein the method further comprises removing the connecting hinge after the base is fixed to the cover.

70. The method of claim 69, wherein the plastic jointing material is injected into the peripheral annular region.

71. The method of claim 69, further comprising bonding the base and the cover to each other via one of an adhesive, a cyanoacrylate adhesive, and an epoxy.

72. The method of claim 69, further comprising securing the electronic device to one of the cover and the base using one of an adhesive, a cyanoacrylate adhesive, and an epoxy.

73. A method of making a token comprising a plastic cover having an external surface and a base engaging surface, a plastic base having an external surface and a cover engaging surface, the base being attached to the cover, an axial spacing projection for maintaining a space between the base and the cover, the axial spacing projection being disposed on the cover engaging surface of the base and comprising a first height, wherein the axial spacing projection further comprises one of a continuous ring and a discontinuous ring, a closure ring disposed on the base engaging surface of the cover and comprising one of a continuous ring and a discontinuous ring, a peripheral annular region comprising a space having a second height and disposed adjacent an edge of the token, the peripheral annular region being defined by the axial spacing projection, wherein the first height is approximately equal to the second height, an electronic device comprising an electronic circuit which includes one of a memory containing identification, a coding information, and a transmitter-receiver having a peripheral antenna, an internal central region comprising a receptacle for receiving the electronic device, the internal central region being defined by the axial spacing projection, a plastic jointing material disposed in the peripheral annular region, wherein the plastic jointing secures the base to the cover, wherein the axial spacing projection comprises a plane circular region surmounted by a band of protuberances which are arranged in a circular arrangement, the plane circular region and the band of protuberances cooperating to retain the electronic device in place within the token and wherein the closure ring and the axial spacing projection engage and axially overlap one another when the cover is fixed to the base, the method comprising:

forming the cover and the base by injection molding;

locating the electronic device between the plastic cover and the plastic base;

joining the plastic cover and the plastic base; and injecting the plastic jointing material between the plastic cover and the plastic base to fixedly secure the plastic cover to the plastic base.

74. The method of claim 73, wherein the plastic jointing material is injected into the peripheral annular region.

75. The method of claim 73, further comprising bonding the base and the cover to each other via one of an adhesive, a cyanoacrylate adhesive, and an epoxy.

76. The method of claim 73, further comprising securing the electronic device to one of the cover and the base using one of an adhesive, a cyanoacrylate adhesive, and an epoxy.

77. The method of claim 73, wherein the forming comprises injection molding the base and the cover simultaneously.

78. The method of claim 77, wherein the base and the cover are injection molded with a connecting hinge and wherein the method further comprises removing the connecting hinge after the base is fixed to the cover.

* * * * *